United States Patent [19]

Duerr

[11] Patent Number: 5,969,526
[45] Date of Patent: Oct. 19, 1999

[54] TRANSMISSION/RECEPTION ARRANGEMENT FOR A DIAGNOSTIC MAGNETIC RESONANCE APPARATUS

[75] Inventor: Wilhelm Duerr, Erlangen, Germany

[73] Assignee: Siemens Aktiengesellschaft, Munich, Germany

[21] Appl. No.: 08/879,820

[22] Filed: Jun. 20, 1997

[30] Foreign Application Priority Data

Jun. 20, 1996 [DE] Germany .......................... 196 24 682

[51] Int. Cl.$^6$ ................................................. G01V 32/00
[52] U.S. Cl. ......................... 324/318; 324/322; 324/309
[58] Field of Search .................................... 324/318, 322, 324/309

[56] References Cited

U.S. PATENT DOCUMENTS

| | | |
|---|---|---|
| 4,467,282 | 8/1984 | Siebold . |
| 4,742,304 | 5/1988 | Schnall et al. . |
| 5,208,537 | 5/1993 | Rietsch et al. . |

OTHER PUBLICATIONS

Patents Abstracts of Japan, P-1834, Nov. 29, 1994, vol. 18/No. 627, for Japanese Application No. 5–25363.
Boylestad, R.L. Introductory Circuit Analysis (Columbus, Ohio: Merrill Publishing Co., 1987).

*Primary Examiner*—Christine K. Oda
*Assistant Examiner*—Brij B. Shrivastan
*Attorney, Agent, or Firm*—Hill & Simpson

[57] ABSTRACT

A transmission/reception arrangement for a diagnostic magnetic resonance apparatus has an antenna, a matching and tuning circuit and a signal transmission line. The antenna together with the matching and tuning circuit is fashioned for exciting and/or receiving proton magnetic resonance signals having a first frequency. A reactance circuit is connected between the matching and tuning circuit and the signal transmission line. The reactance circuit is fashioned such that a reflection factor to the second transmission line substantially disappears at a second frequency. The apparatus is thus provided with the capability of conducting examinations using hyperpolarized gases, while still preserving the capability of conducting imaging with conventional proton ($^1$H) signals without modification.

9 Claims, 3 Drawing Sheets

TRANSMISSION/RECEPTION ARRANGEMENT FOR A DIAGNOSTIC MAGNETIC RESONANCE APPARATUS

BACKGROUND OF THE INVENTION

1. Field of the Invention

The present invention is directed to a transmission/reception arrangement for a diagnostic magnetic resonance apparatus of the type having an antenna, a matching and tuning circuit, and a signal transmission line, the antenna being fashioned together with the matching and tuning circuit for exciting and/or receiving proton magnetic resonance signals at a particular frequency.

2. Description of the Prior Art

U.S. Pat. No. 4,467,282 discloses a transmission/reception arrangement of the above type. The apparatus has an antenna for exciting and/or receiving proton magnetic resonance signals at a frequency that is determined by the basic magnetic field. The relationship between the frequency of the magnetic resonance signals and the basic magnetic field is predetermined by the gyromagnetic constant. To compensate for detuning of the antenna as a result of the introduction of a patient to be examined into the examination volume, a matching and tuning two-port circuit is provided. The matching and tuning circuit is fundamentally composed of an adjustable series capacitance and an adjustable parallel capacitance as disclosed in detail in, for example, U.S. Pat. No. 5,208,537. The antenna is optimized for proton imaging for employment in medical diagnostics.

Multiply resonant antenna arrangements as disclosed, for example, in U.S. Pat. No. 4,742,304, are employed for magnetic resonance spectroscopy examination. The matching and tuning circuit belonging to the antenna is fashioned so as to be multiply resonant therein.

Imaging with hyperpolarized gases a topic currently under active discussion in this field, for example, for imaging the lung, which offers new employment possibilities for a whole-body magnetic resonance apparatus. Imaging with inert gases such as, for example, xenon ($^{129}$Xe) and helium ($^3$He) that are polarized by optical pumping with a laser light source are in the foreground of the discussions involving this technique. Polarization degrees of above 50% thus can be achieved. The gyromagnetic constants of $^{129}$Xe and $^3$He, however, differ substantially from the gyromagnetic constant of hydrogen. Whereas hydrogen has a gyromagnetic constant of 42.7 MHZ per Tesla, the gyromagnetic constant of $^3$He is only approximately 32.3 MHZ per Tesla and that of $^{129}$Xe is only approximately 11.8 MHZ per Tesla. Some non-hyperpolarized gases also exhibit imaging properties that can be utilized in medical diagnostics. These Include gases that contain fluorine such as, for example, carbon tetrafloride ($CF_4$) and sulfurhexafluoride ($SF_6$). As in conventional proton imaging, these gases are polarized with a highly uniform basic magnetic field. The gyromagnetic constant of fluorine, at 40 MHZ per Tesla differs significantly from the gyromagnetic constant of protons. A conventional resonance apparatus thus can not be employed without further modification for imaging of hyperpolarized gases or such non-hyperpolarized gases. In particular, the employment of a conventional whole-body transmission antenna for lung imagings making use of the imaging processes of these gases would be desirable because of the large-volume and uniform excitation which could be achieved.

SUMMARY OF THE INVENTION

An object of the present invention is to provide a transmission/reception arrangement for imaging with media whose gyromagnetic constants differ from that of a proton, so as to allow use of a conventional antenna, having a corresponding matching and tuning circuit for proton imaging, without modification.

This object is achieved in a transmission/reception arrangement having a reactive circuit connected between a matching and tuning circuit and the signal transmission line, the reactive circuit being fashioned for causing a reflection factor at the terminal of the signal transmission line to substantially disappear at a second frequency. A conventional antenna optimized for proton imaging thus can be employed for imaging of hyperpolarized media with a second frequency. In particular, a whole-body antenna can be employed without modifications. An adequate matching can also be achieved at the magnetic resonant frequency of the hyperpolarized media with the reactive two-port circuit connected in front of the matching and tuning circuit. The antenna itself then in fact no longer operates quite as efficiently as in the proton imaging at the first frequency. The angular pulse excitation given hyperpolarized gases, however, can lie only in the order of magnitude of one degree because of the long relaxation times, which means that only fractions of the otherwise standard radio-frequency power are required for the excitation. The power emitted by the antenna is then still adequate even for imaging of compounds containing fluorine.

In an embodiment of the arrangement an asymmetric half section is employed as the reactive circuit. The reflection factor at the terminal connected to the signal transmission line can be adequately reduced with this relatively simply constructed reactive circuit, so that, first, the transmitter is not damaged by reflected radio-frequency power and, second an adequate radio-frequency power is emitted by the antenna for the excitation.

In a further embodiment of the inventive transmission/reception arrangement, the aforementioned asymmetrical half section has first and second inductive elements, and in that the first inductive element arranged in a series arm and the second inductive element is arranged in a shunt arm of the asymmetrical half section. In particular, an imaging is thus possible with the hyperpolarized gases $^3$He and $^{129}$Xe as well as fluorine because their gyromagnetic constants lie below that of protons ($^1$H).

In another embodiment means for eliminating the effect of the reactive circuit and for direct electrical connection of the signal line to the matching and tuning circuit are connected to the reactance circuit. The same whole-body antenna— with the corresponding radio-frequency transmitters and receivers—can thus be employed for proton imaging as well as for imaging of media having a gyromagnetic constant.

A further embodiment operates without any special control of the reactive circuit with the matching and tuning circuit and the antenna, by having means for eliminating the effect of the reactive circuit and for the direct electrical connection formed by a resonant circuit which resonates at the first frequency. The matching at the first frequency is thus preserved due to the frequency-dependent elements even given direct connection of the reactive two-port circuit.

DESCRIPTION OF THE PREFERRED EMBODIMENTS

Figure 1:
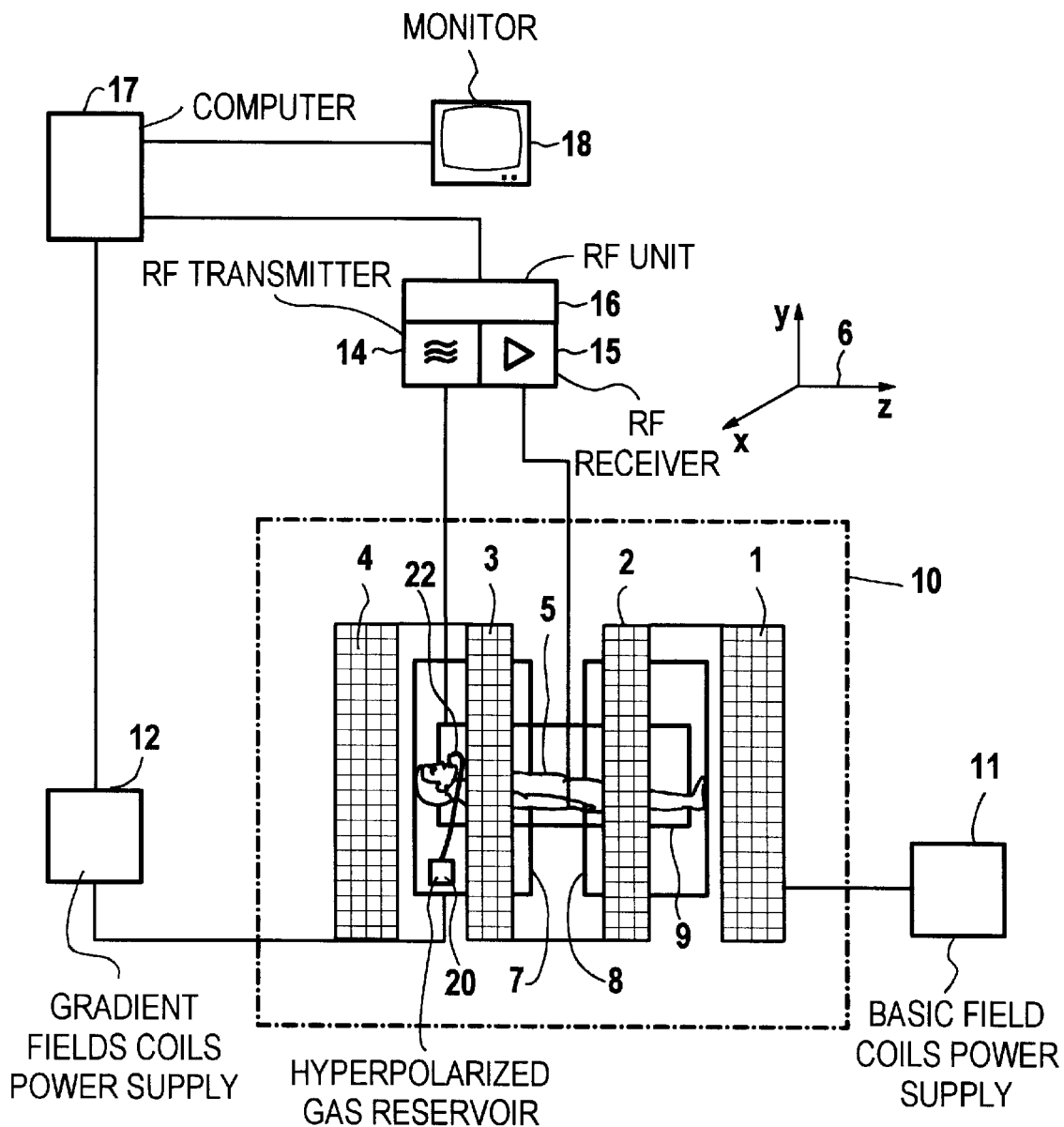
FIG. 1 is a schematic illustration of a diagnostic magnetic resonance apparatus for proton imaging and imaging with hyperpolarized media constructed in accordance with the principles of the present invention.

In the schematic illustration of a magnetic resonance apparatus for determining proton images and/or images of hyperpolarized media shown in FIG. 1, reference coils 1, 2, 3 and 4 generate a basic magnetic field $B_0$ in which, given medical application, the body 5 of the patient to be examined is located. Gradient coils are also allocated to the basic field $B_0$, for generating independent, mutually perpendicular magnetic field gradients respectively in the x, y, z, directions according to a rectangular coordinate system 6. For clarity, only gradient coils 7 and 8 are shown in FIG. 1, which together with a pair of identical gradient coils lying opposite, generate a gradient in the x-direction. Identical gradient coils that are not shown lie parallel to the body 5 above and below it for generating a gradient in the y-direction. Gradient coils for the gradient field in z-direction lie at the foot and at the head ends transversely relative to the longitudinal axis of the body 5. The arrangement also contains a transmission/reception arrangement 9, which may be operable at multiple frequencies, and which includes a whole-body antenna, for generating and/or for receiving the magnetic resonance signals for imaging of hyperpolarized media and, in accordance with the invention, for proton imaging as well.

The actual examination instrument is composed of the coils 1, 2, 3, 4, 7 and 8 bounded by a dot-dash line 10, and the further gradient coils (not shown) as well as the transmission/reception arrangement 9. A power supply 11 is provided for the operation of the coils 1–4. A gradient power supply 12 feeds the gradient coils 7 and 8 as well as the other gradient coils that are not shown. A radio-frequency transmitter 14 that can generate two frequencies of, for example, $f_1$=64 MHZ for proton imaging and $f_2$=48 MHZ for $^3$He imaging is controlled by a process-control computer 17. The transmitter 14 is connected to the transmission/reception arrangement 9. A reception amplifier 15 whose output is supplied to the process-control computer 17 is likewise connected to the transmission and/or reception antenna 9. The components 14 and 15 form an RF unit 16 for generating and for picking up electrical signals. The received magnetic resonance signals are processed by the process-control computer 17 to form image data that can then shown at a display screen of a monitor 18, connected to the process-control computer 17.

The whole-body antenna is optimized for proton imaging at the first frequency of, for example, $f_1$=64 MHZ. The whole-body antenna 9 belongs to the inventive transmission and/or reception arrangement 9 so that imaging of hyperpolarized media, such as hyperpolarized helium in the exemplary embodiment, can be implemented with the second frequency of, for example, $f_2$=48 MHZ. Hyperpolarized helium is particularly suited for imaging the lung and is supplied for respiration to the patient from a reservoir 20 via a hose conduit 22. The helium gas is polarized before the examination, for example by spin-exchange collisions with optically pumped rubidium atoms, with the rubidium being pumped with light energy from a laser diode.

Figure 2:
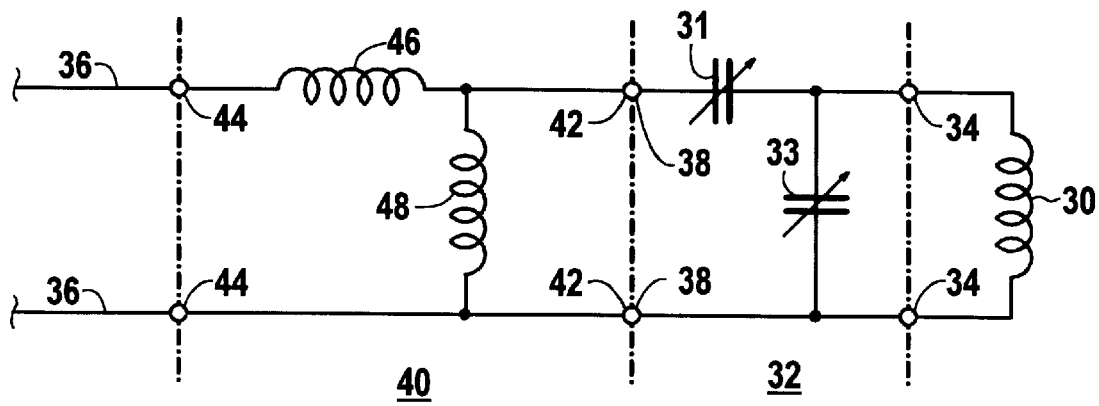
FIG. 2 is a schematic circuit diagram of a transmission/reception arrangement with a reactive two-port circuit constructed in accordance with the principles of the present invention.

FIG. 2 shows a schematic electrical diagram of the transmission and reception arrangement 9 for exclusive imaging of a hyperpolarized gas at the second frequency. The transmission/reception arrangement 9 contains an antenna 30 and a matching and tuning circuit 32 in the form of a two-port circuit. The matching and tuning circuit 32 is basically composed of an adjustable series capacitor 31 and an adjustable parallel capacitor 33 for compensating detuning of the antenna 30 caused by different loads. The antenna 30 is connected to a first port 34 of the matching and tuning circuit 32. It should be noted that the antenna 30 with the matching and tuning circuit 32 is optimized for exciting and/or receiving proton magnetic resonance signals having a first frequency. In a conventional magnetic resonance apparatus, a signal transmission line 36 would be connected to a second port of the matching and tuning circuit 32. For imaging with hyperpolarized gases, however, reactive two-port circuit 40 is connected between the signal transmission line 36 and the second port 38 of the matching and tuning circuit 32. The second port 38 of the matching and tuning circuit 32 is thus connected to a first port 42 of the reactance two-port circuit 40, and the end of the signal transmission line 36 is connected to a second port 44 of the reactance two-port circuit 40. The connection between the matching and tuning circuit 32 and the reactive two-port circuit 40 should thereby be implemented as short as possible so that no standing waves at the second frequency can form on this connection, which would result in a part of the radio-frequency power being converted into heat and lost as dissipated power.

The reactive two-port circuit 40 is realized as an asymmetrical half section having a series inductance 46 in the series arm and a parallel inductance 48 in a shunt arm arranged parallel to the first port 42. The inductance values of the series inductance 46 and the parallel inductance 48 are dimensioned such that a reflection factor at the second gate port 44 of the reactance two-port circuit 40 substantially disappears given imaging with hyperpolarized gases at the second frequency. As a result of the substantially lower radio-frequency power for exciting the magnetic resonance signals for imaging with hyperpolarized gases, the reflection factor need not be made to entirely disappear. For example, a reduction to 10–50% suffices. Compared thereto, the reflection factor without the reactive two-port circuit 40 at the second frequency would be nearly 100%.

Figure 3:
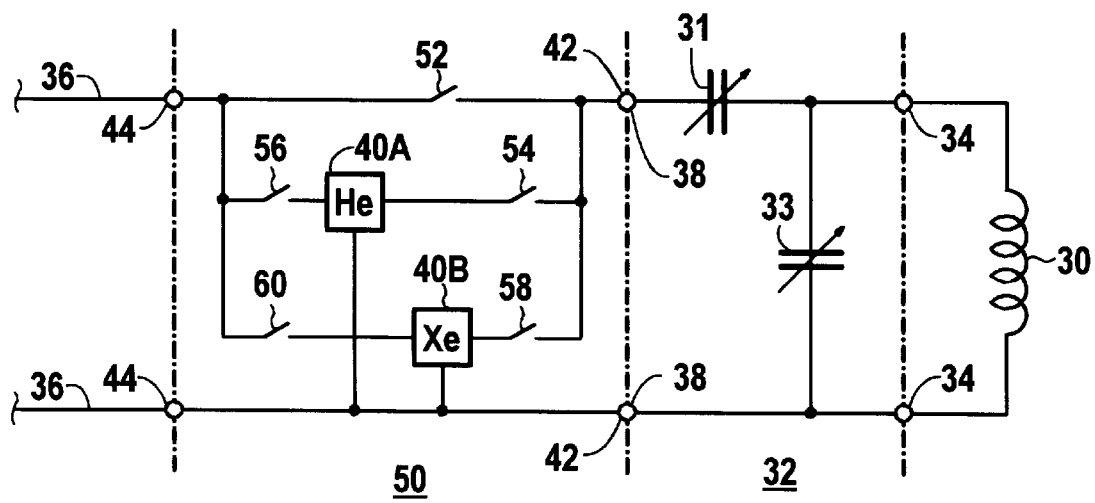
FIG. 3 is a schematic circuit diagram of a reactive two-port circuit that can be switched to a number of frequencies constructed in accordance with the principles of the present invention.

FIG. 3 shows a combination of reactive two-port circuits 50 that includes a reactive two-port circuit 40A for helium imaging and a reactive two-port circuit 40B for xenon imaging. In addition, switches are provided in the combination circuit that connect either of the two-port circuits 40A or 40B, or neither of the two, into the signal path between the signal transmission line 30 and the matching and tuning circuit 32. A first switch 52 is arranged between the first port 42 and the second port 44. In series with the series arm of the reactive two-port circuit 40A for helium imaging, a switch 54 is connected to the first port 42 at a switch 56 is connected to the second port 44. In series with the series arm of the reactive two-port circuit 40B for xenon imaging, a switch 58 is connected to the first port 42 and a switch 60 is connected to the second port 44. The switches 52, 54, 56, 58 and 60 are controlled according to the frequency of the magnetic resonance signals. Thus, for imaging at the first frequency, the switch 52 is closed, whereas the switches 54, 56, 58, 60 are opened at the same time. For imaging with hyperpolarized helium, the switches 54 and 56 are closed, whereas the switches 52, 58 and 60 are opened. Analogously, the switches 58 and 60 are closed for imaging with hyperpolarized xenon, with the switches 52, 54 and 56 being open. Even for imaging with three different frequencies, as well, the antenna 30 with the matching and tuning circuit 32 is only optimized for conventional proton imaging; no multi-frequency antenna structures are employed.

Figure 4:
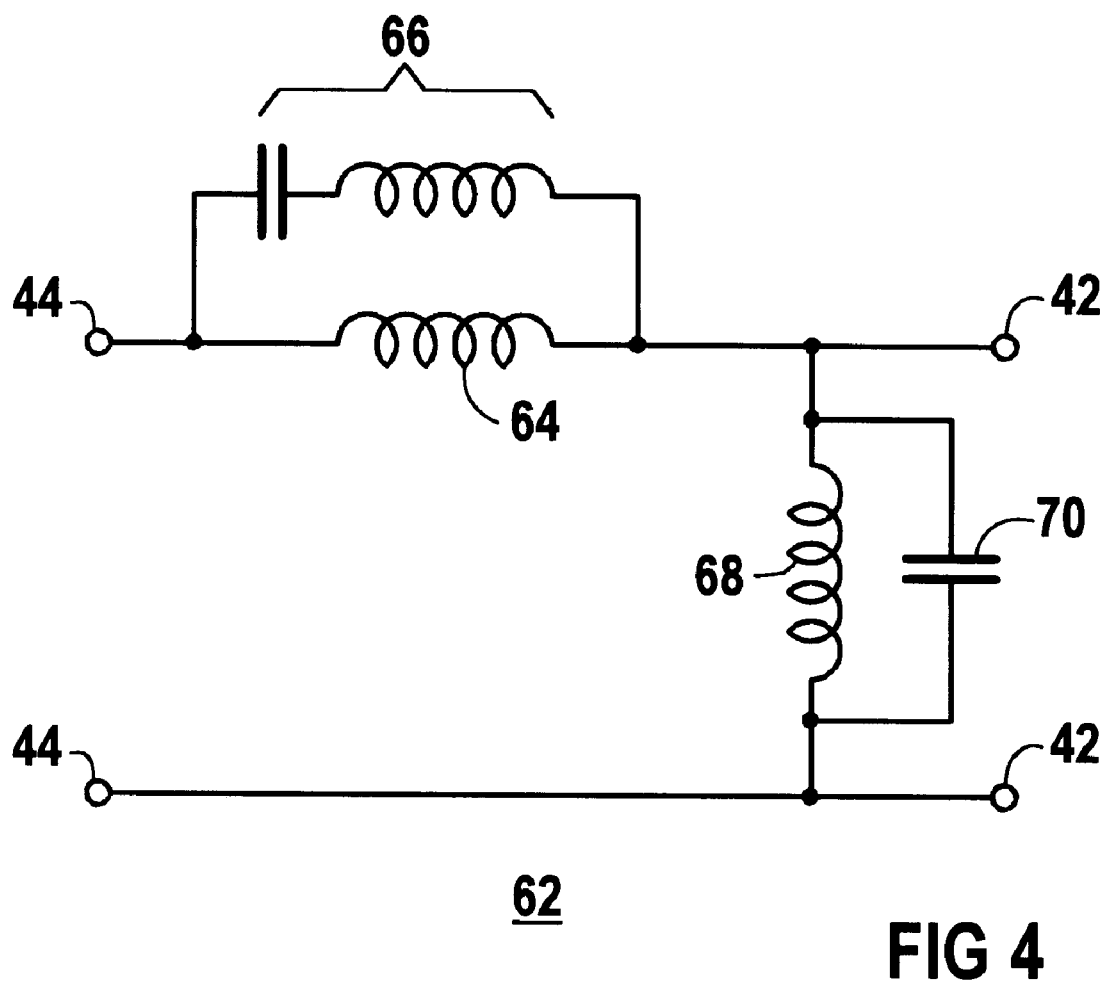
FIG. 4 is a schematic circuit diagram of a reactive two-port circuit with frequency-dependant elements for eliminating their effect at the first frequency constructed in accordance with the principles of the present invention.

FIG. 4 shows a further exemplary embodiment of a reactive two-port circuit combination 62 that can be connected between the signal transmission line 36 and the matching and tuning circuit 32. Due to the additional employment of frequency-dependent elements, the reactive two-port circuit combination 62 does not require any switches for changing its behavior at the first and second frequencies. The reactive two-port circuit combination 62 has the structure of an asymmetrical half section with a series arm and a shunt arm. The series arm has an inductance 64 and a series resonant circuit 66 connected in parallel with the inductance 64. The shunt arm has an inductance 68 and a capacitor 70 connected in parallel. At the first frequency for proton imaging, the series resonant circuit 66 and the parallel resonant circuit formed by the inductance 68 and the capacitor 70 is in resonance, as a result of which the reactive effect of the reactive two-port circuit combination 62 is eliminated and the ports 42 and 44 are directly electrically connected to one another. The elements 64, 66, 68 and 70 of the reactive two-port circuit combination 62, further, are dimensioned such that the reflection factor at the second port is largely reduced in imaging with, for example, polarized helium at the second frequency. The functioning of the reactive two-port circuit combination 62 then corresponds to the reactive two-port circuit 40 already explained with reference to FIG. 2, i.e. the inductance 64 together with the series resonant circuit 66 acts like the series inductance 46 and the inductance 68 together with the capacitor 70 acts like the parallel inductance 48.

Although modifications and changes may be suggested by those skilled in the art, it is the intention of the inventor to embody within the patent warranted hereon all changes and modifications as reasonably and properly come within the scope of his contribution to the art.

I claim as my invention:

1. In a diagnostic magnetic resonance apparatus having an antenna operable at a resonant frequency and a matching and tuning circuit connected via a signal transmission line, said matching and tuning circuit comprising means for exciting and receiving proton magnetic resonance signals at a first frequency, the improvement comprising:

a reactive circuit connected between said matching and tuning circuit and said transmission line, said reactive circuit comprising means for causing a reflection factor at a terminal of said signal transmission line to substantially disappear at a second frequency, different from said first frequency, without substantially altering said resonant frequency of said antenna.

2. The improvement of claim 1 wherein said reactive circuit comprises an asymmetrical half section.

3. The improvement of claim 2 wherein said asymmetrical half section comprises a series arm containing a first inductive element and a shunt arm containing a second inductive element.

4. The improvement of claim 1 wherein said reactive circuit has a reactive effect, and further comprising circuit means connected to said reactive circuit for cancelling said reactive effect and producing a direct, non-reactive electrical path between said transmission line and said matching and tuning circuit.

5. The improvement of claim 4 wherein said circuit means comprises a plurality of switches.

6. The improvement of claim 4 wherein said circuit means comprises a plurality of resonant circuits respectively resonating at said first frequency.

7. The improvement of claim 6 wherein said reactive circuit comprises at least one series arm, and wherein said plurality of resonant circuits include a resonant circuit bridging said at least one series arm.

8. The improvement of claim 6 wherein said reactive circuit comprises at least one shunt arm and wherein said plurality of resonant circuits include a resonant circuit having an auxiliary reactance forming a parallel resonant circuit with said at least one shunt arm.

9. The improvement of claim 6 wherein said reactive circuit comprises at least one series arm and at least one shunt arm, and wherein said plurality of resonant circuits include a series resonant circuit bridging said at least one series arm and a parallel resonant circuit containing an auxiliary reactance in parallel with said at least one shunt arm.

* * * * *